United States Patent [19]

Lin

[11] Patent Number: 5,421,402
[45] Date of Patent: Jun. 6, 1995

[54] HEAT SINK APPARATUS

[76] Inventor: Chuen-Sheng Lin, No. 31, Sec. 1, Min Yi Road, Wu-Ku Hsiang, Taipei Hsien, Taiwan, Prov. of China

[21] Appl. No.: 346,176

[22] Filed: Nov. 22, 1994

[51] Int. Cl.⁶ ............................................. F28F 7/00
[52] U.S. Cl. .................................. 165/80.3; 165/121; 361/697
[58] Field of Search ................... 165/80.3, 121, 122, 165/185; 361/697, 709

[56] References Cited

U.S. PATENT DOCUMENTS

| | | | |
|---|---|---|---|
| 4,682,651 | 7/1987 | Gabuzda | 165/80.3 |
| 5,287,249 | 2/1994 | Chen | 361/718 |
| 5,288,203 | 2/1994 | Thomas | 415/178 |
| 5,299,632 | 4/1994 | Lee | 165/80.3 |
| 5,309,983 | 5/1994 | Bailey | 165/80.3 |
| 5,335,722 | 8/1994 | Wu | 165/122 |
| 5,368,094 | 11/1994 | Hung | 165/80.3 |
| 5,377,745 | 1/1995 | Hsieh | 165/80.3 |

*Primary Examiner*—Allen J. Flanigan
*Attorney, Agent, or Firm*—Browdy and Neimark

[57] ABSTRACT

A heat sink apparatus includes a heat dissipation base made of material of high heat conductivity having a plate portion in tight contact engagement with a surface of an electronic device for conducting away heat generated by the electronic device. The plate portion has a number of spaced fins extending therefrom to surround a non-finned zone on the top surface of the plate portion. A retainer in the form of a hollow frame having an inner shoulder fit over a circumferential edge of the plate portion serves to fix the heat dissipation base to the electronic device by having resilient hooks of the retainer engage with a bottom edge of the electronic device. A fan assembly has a support plate with a central opening to be supported on the fins with the opening opposing the non-finned zone. A rotor/blade subassembly is rotatably supported on the support plate and partially received within the non-finned zone to rotate therein for generation of air flows through spacings between the fins and then expelled through the central opening to perform forced convection. The support plate has a plurality of resilient hooks formed thereon to releasably engage notches formed on the heat dissipation base for fixing the fan assembly on the heat dissipation base.

4 Claims, 3 Drawing Sheets

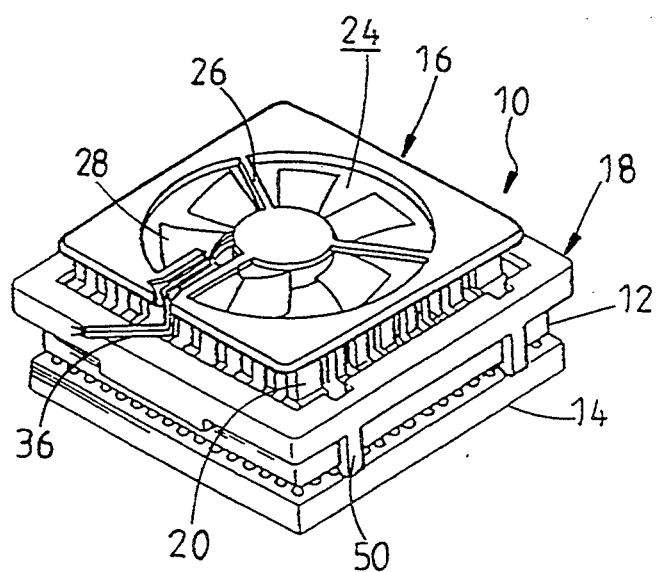
F I G. 1

HEAT SINK APPARATUS

FIELD OF THE INVENTION

The present invention relates generally to a heat sink apparatus which is for use with an electronic device, particularly a semiconductor integrated circuit (IC) chip, to remove or dissipate the heat generated during operation of the electronic device and thus maintain the electronic device at a desired operating temperature.

BACKGROUND OF THE INVENTION

Many electronic devices, especially semiconductor chips, such as a central processing unit (CPU) chip, for example Intel 80486 (registered mark of Intel Co.) chip, operate in a limited temperature range, and they usually malfunction when the temperature is outside the range. On the other hand, electronic devices generate heat during operation. To maintain proper operation temperature, the heat generated during the operation of the electronic devices must be removed or dissipated.

Heat sink apparatus have been already known for removal or dissipation of thermal energy from electronic devices. Examples of such heat sink apparatus are U.S. Pat. Nos. 4,879,891, 4884,331 and 4,745,456, UK patent No. 2,195,051 which is a counterpart of U.S. Pat. No. 4,745,456, and Chinese patent No. 93 2 22472.5 which all disclose a heat sink having a body to be secured to a surface of a heat generating electronic device in a thermal contact manner and a plurality of spaced heat dissipating fins or pins extending from the body to dissipate thermal energy generated by the electronic device to the environment. These prior art heat sink apparatus dissipate heat by natural convection occurring between the fins or pins that are heated by the thermal energy generated by the electronic device and the low temperature environmental air.

Due to the development of high power semiconductor devices, the amount of thermal energy to be removed from semiconductor devices increases and natural convection may no longer be sufficient for properly removing heat from the electronic devices. To increase the heat removal efficiency, heat sink apparatus is improved by incorporating a fan to cause air flow to performing forced convection, which fan is generally disposed on the top of the fins to generate the required air flow through the fins of the heat sink apparatus for force convection. Examples of the forced convection type heat sink apparatus for IC chip are Taiwan Patent Application Nos. 83204206 and 83212398 and U.S. patent Ser. No. 08/257,106, all filed by the applicant of the present invention.

The prior art forced convection type heat sink apparatus, although working well in removing heat, require separate or additional fasteners, such as screws, to secure them together. This complicates the assembly of the heat sink apparatus and increases the overall cost.

It is therefore desirable to provide a forced convection type heat sink apparatus which overcomes the deficiencies of the prior art heat sink apparatus.

SUMMARY OF THE INVENTION

The primary object of the present invention is to provide a forced convection type heat sink apparatus which has a simple structure and ready to assemble on an electronic device, such as a CPU.

Another object of the present invention is to provide a heat sink apparatus which needs no fasteners, such as screws, in assembly so as to simplify the assembly work and reduce the cost.

To achieve the above objects, according to the present invention, there is provided a heat sink apparatus comprising a heat dissipation base made of material of high heat conductivity having a plate portion in tight contact engagement with a surface of an electronic device for conducting away heat generated by the electronic device. The plate portion has a number of spaced fins extending therefrom to surround a non-finned zone on the top surface of the plate portion. A retainer in the form of a hollow frame having an inner shoulder fits over a circumferential edge of the plate portion serves to fix the heat dissipation base to the electronic device by having resilient hooks of the retainer engage with a bottom edge of the electronic device. A fan assembly has a support plate with a central opening to be supported on the fins with the opening opposing the non-finned zone. A rotor/blade sub-assembly is rotatably supported on the support plate and partially received within the non-finned zone to rotate therein for generation of air flows through spacings between the fins and then expelled through the central opening to perform forced convection. The support plate has a plurality of resilient hooks formed thereon to releasably engage notches formed on the heat dissipation base for fixing the fan assembly on the heat dissipation base.

BRIEF DESCRIPTION OF THE DRAWINGS

The structural and operational characteristics of the present invention and advantages thereof, as compared to the known state of the art, will be better understood from the following description of a preferred embodiment of the present invention, with reference to the attached drawings, wherein:

FIG. 1 is a perspective view showing a heat sink apparatus in accordance with the present invention mounted on an IC chip;

DETAILED DESCRIPTION OF THE PREFERRED EMBODIMENT

Figure 2:
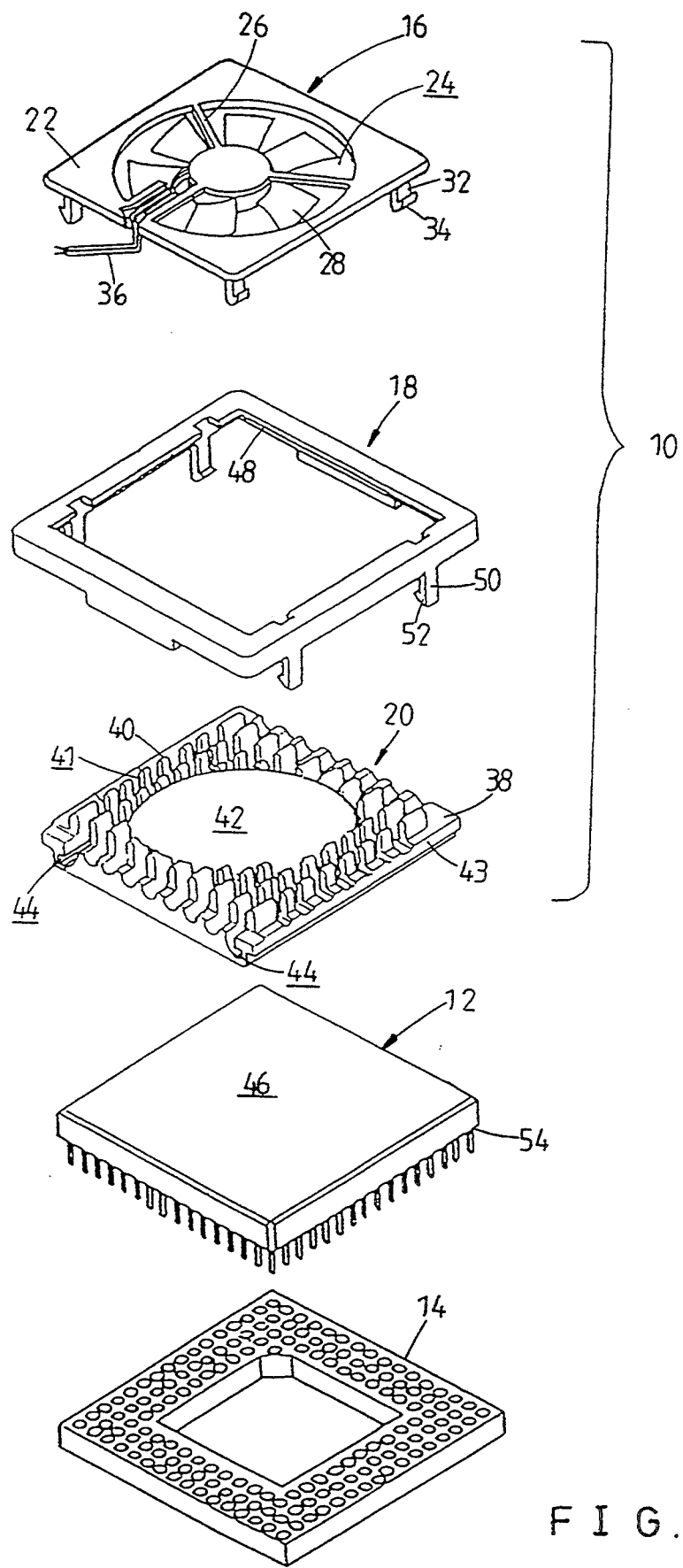
FIG. 2 is an exploded perspective view showing the heat sink apparatus and the IC chip illustrated in FIG. 1.

With reference to the drawings and in particular to FIGS. 1 and 2, wherein a heat sink apparatus constructed in accordance with the present invention, generally designated with the reference numeral 10, is shown mounted to an electronic device 12, such as an IC chip and particularly a CPU, for removal or dissipation of the heat generated within the electronic device 12 during its operation. For the example illustrated in the drawing, the electronic device 12 is mounted to a printed circuit board (not shown) by means of a connector 14, which connection may be provided by pin-slot pairs as illustrated. This part, however, constitutes no feature of the present invention and thus no further detail will be given herein. It should be noted that the showing of the electronic device 12 and the connector 14 is only for the illustration of the mounting of the heat sink apparatus 10 of the present invention on the electronic device 12.

The heat sink apparatus 10 of the present invention, as best shown in FIG. 2, comprises a fan assembly 16, a retainer frame 18 and a heat dissipation base 20. The fan sub-assembly 16 is further shown in FIG. 3 which is viewed from a different angle from that of FIGS. 1 and 2.

The heat dissipation base 20 comprises a plate member 38 having an under surface adapted to rest on a surface of the electronic device 12, preferably the top surface 46 of the electronic device 12, and a top surface on which a plurality of fins 40 are formed and extending therefrom a given distance in a direction facing away from the under surface of the plate member 38.

In the embodiment illustrated, the electronic device 12 has a rectangular shape and correspondingly the plate member 38 of the heat dissipation base 20 is a rectangular member so as to be snugly disposed over the top surface 46 of the electronic device 12.

A non-finned zone 42 is formed on the top surface of the plate member 38 and preferably located at the center of the top surface to be surrounded by the fins 40. In the embodiment illustrated, the non-finned zone 42 is a circular surface area of the plate member 38 which is suitable to partially receive therein a rotor/blade sub-assembly 28 of the fan assembly 16 which will be further described hereinafter.

The fins 40 are disposed in a spaced-apart manner to define therebetween air passage gaps 41 which extend from the non-finned zone 42 toward outside of the fins 40 so as to allow air to flow into the non-finned zone 42. Preferably, the fins 40 are arranged to be a matrix that has fins lined up along a first direction and a second direction with the gaps forming air passages directly toward the non-finned zone 42. The first and second directions of the fin arrangement are preferably normal to each other so as to define an "orthogonal fin matrix", as shown in the drawings.

The plate member 38 has a circumferential edge 43 which defines a shoulder with the fins 40 that extend from the plate member 38. A retainer 18 in the form of a hollow frame, which in the example shown in the drawings is a rectangular frame, comprises an inner shoulder 48 corresponding to the circumferential edge 43 of the plate member 38 and fittable over the shoulder of the plate member 38. The retainer 18 comprises a plurality of resilient rods 50 extending therefrom toward an under side 54 of the electronic device 12. Each of the rods 50 has a hooked lower end 52 which is releasably engageable with a circumferential edge of the under side 54 of the electronic device 12 so as to retain the heat dissipation base 20 on the surface 46 of the electronic device 12.

In the embodiment illustrated, there are four such rods 50 extending in pair from two opposite sides of the rectangular frame of the retainer 18.

The fan assembly 16 comprises a support plate 22, which in the embodiment illustrated is a rectangular plate member, having a through hole 24 formed thereon, preferably formed at the central portion of the support plate 22. A rotor/blade sub-assembly 28 is concentrically supported within the hole 24 by means of ribs 26 extending from the rotor/blade sub-assembly 28 to the circumference of the hole 24. The rotor/blade sub-assembly 28 is so constructed and supported by the ribs 26 that the blades of the fan assembly 16 are allowed to rotate within the hole 24 upon actuated and driven by control signals and electricity sent via wires 36. The structure of the rotor/blade sub-assembly 28 is already known to those skilled in the art and thus will no further described.

Figure 3:
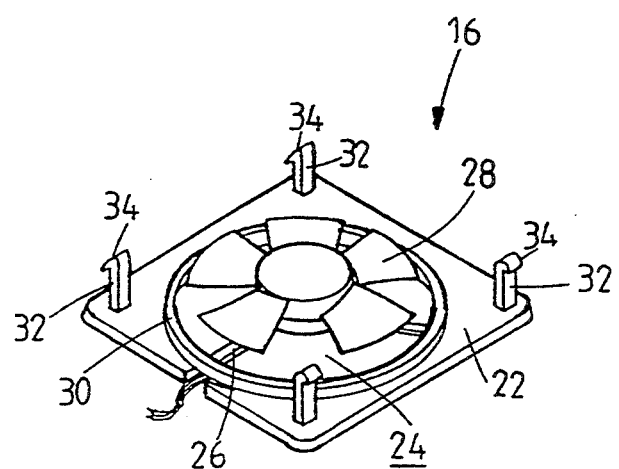
FIG. 3 is a perspective view showing the fan assembly viewed from a different angle.

The rotation of the rotor/blade sub-assembly 28 causes an air flow through the hole 24. To more effectively guide the air flow through the hole 24, a circumferential flange 30 is formed on an under side of the support plate 22, surrounding the hole 24, as shown in FIG. 3. The flange 30 extends away from the under side of the support plate 22 a short distance toward the base 20 to form a channel for guiding the air flow to move from the under side of the support plate 22, through the hole 24, toward the top side of the support plate 22.

The fan assembly 16 is disposed on top ends of the fins 40 to be supported thereby with the rotor/blade sub-assembly 28 partially received within the non-finned zone 42. Preferably the hole 24 has a shape corresponding to the non-finned zone 42 so as to allow the support plate 22 to substantially completely cover the fins 40 mounted on the plate member 38 of the heat dissipation base 20.

The support plate 22 has a plurality of resilient rods 32 extending from the under side thereof and each of the rods 32 has a lower end with a hook 34 formed thereof. Corresponding to the hooks 34, the heat dissipation base 20 has notches or recesses 44 formed thereon, preferably formed on the fins 40 of the plate member 38, to engage and retain the hooks 34 therein so as to fix the fan assembly 16 on the heat dissipation base 20.

In the embodiment illustrated, there are four such rods 32 extending in pair from two opposite edges of the under side of the support plate 22 of the fan assembly 16 to engage four corresponding notches 44 of the heat dissipation base 20.

The control signals and electricity sent through the wires 36 drive the rotor/blade sub-assembly 28 of the fan assembly 16 to rotate within the non-finned zone 42 which causes an air flow through the hole 24. The air flow so formed evacuates the air inside the non-finned zone 42 which causes air outside the fins 40 to flow inward through the air passages defined by the gaps 41 between the fins 40. By the air flows through the gaps 41, forced convection between the air flows and the fins 40 and/or the plate member 38 occurs which removes the heat energy stored within the heat dissipation base 20. Quite obviously, the heat dissipation base 20 is made of material of high heat conductivity and the plate member 38 is in tight contact engagement with the surface 46 of the electronic device 12.

It is apparent that although the invention has been described in connection with the preferred embodiment, it is contemplated that those skilled in the art may make changes to certain features of the preferred embodiment without altering the basic concept of the invention and without departing from the spirit and scope of the invention as defined in the appended claims.

What is claimed is:

1. A heat sink apparatus adapted to mount on and dissipate heat generated in an electronic device, said heat sink apparatus comprising:
   a heat conductive base comprising a plate member having a first surface adapted to be in tight contact engagement with a surface of the electronic device and a second surface with a plurality of heat dissipation fins extending therefrom and so arranged to surround a non-finned zone of the second surface of the plate member, the fins being spaced apart from each other to define therebetween gaps serving as air flow passages extending from the non-finned zone to outside the fins;

a retainer in the form of a frame having a shape corresponding to the plate member of the heat conductive base, the frame having an inner shoulder fit over a circumferential edge of the plate member, the retainer further comprising a plurality of first, resilient rods extending therefrom with hooked ends adapted to engage an edge of the electronic device so as to retain the heat conductive base on the electronic device; and a fan assembly comprising a support plate having a shape corresponding to the plate member to be supported on and covering the fins, the support plate having an opening formed thereon and corresponding to the non-finned zone, a rotor/blade sub-assembly being rotatably supported on the support plate and within the opening so as to be partially received within the non-finned zone, the support plate further comprising a plurality of second, resilient rods extending therefrom toward the plate member of the heat conductive base, each of the second rods having a free end with a hook formed thereon to be releasably engageable with corresponding notches formed on the heat conductive base so as to fix the fan assembly on the heat conductive base.

2. A heat sink apparatus as claimed in claim 1, wherein the support plate of the fan assembly comprises a flange surrounding the opening and extending toward the non-finned zone of the plate member of the heat conductive base to define a channel for air flow caused by the rotation of the rotor/blade sub-assembly.

3. A heat sink apparatus as claimed in claim 1, wherein the retainer comprises a rectangular frame having four first rods extending in pair from two opposite edges thereof.

4. A heat sink apparatus as claimed in claim 1, wherein the support plate of the fan assembly comprises four second rods extending therefrom to be respectively engageable with four notches formed on the heat conductive base.

* * * * *